United States Patent [19]

Hetzel

[11] Patent Number: 4,999,820

[45] Date of Patent: Mar. 12, 1991

[54] HOUR METER ACTIVATED BY MAGNETIC INFLUENCE

[76] Inventor: Henry T. Hetzel, 1931 S. County Rd. 19, Loveland, Colo. 80537

[21] Appl. No.: 344,910

[22] Filed: Apr. 28, 1989

[51] Int. Cl.[5] ........................ G04F 8/00; G04B 47/00; G01R 33/00

[52] U.S. Cl. .......................................... 368/9; 368/10; 307/131; 324/260

[58] Field of Search ............... 368/1, 4, 5, 9, 107–113; 324/258, 260, 261, 149, 158 P; 307/116, 131, 413

[56] References Cited

U.S. PATENT DOCUMENTS

| | | | |
|---|---|---|---|
| 3,359,561 | 12/1967 | Shostek | 368/1 |
| 3,465,274 | 9/1969 | Proctor | 324/260 |
| 4,296,376 | 10/1981 | Bartol, Jr. | 324/260 |
| 4,368,424 | 1/1983 | Miller | 324/142 |
| 4,725,996 | 2/1988 | Marble et al. | 368/1 |

*Primary Examiner*—Vit W. Miska
*Attorney, Agent, or Firm*—Edward L. Miller

[57] ABSTRACT

An hour meter is activated by the stray magnetic flux leaking from a piece of equipment to be monitored or surrounding a conductor supplying current to operate that equipment. A tie down rod extends from the housing of the hour meter, and serves the dual function of providing a means to strap the hour meter onto the housing of the equipment and as an antenna to conduct alternating magnetic flux to a coil within the hour meter. There an alternating voltage is induced in the coil, which is rectified by a doubler circuit and applied to a switching transistor, which in turn allows a timer to run from a battery contained within the hour meter. The battery only supplies power to run the timer; the sensing circuit itself is self-powered by the energy induced by inductive coupling to the coil. A coupling adapter plugs into the wall, allows an appliance to be monitored to plug into it, while coils within the coupling adapter serve the dual purpose of supporting the hour meter by surrounding the ends of its tie down rod and coupling magnetic flux thereto, so as to activate the hour meter when the appliance is drawing current.

9 Claims, 3 Drawing Sheets

FIG. 1A
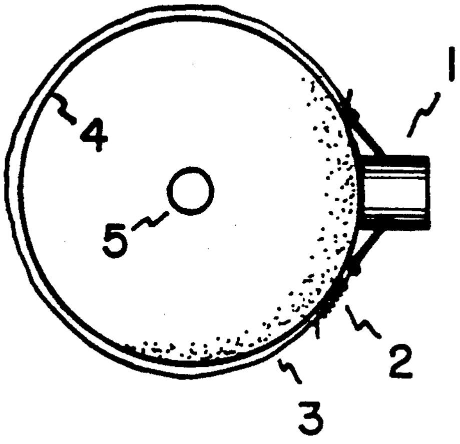
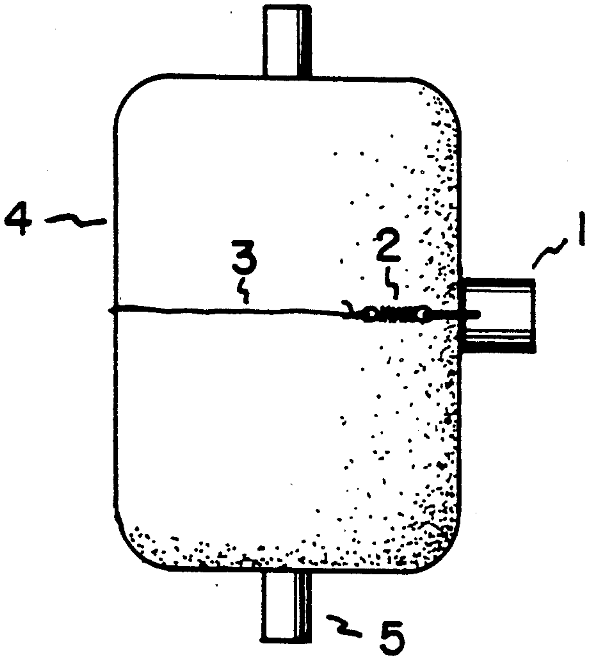
FIG. 1B
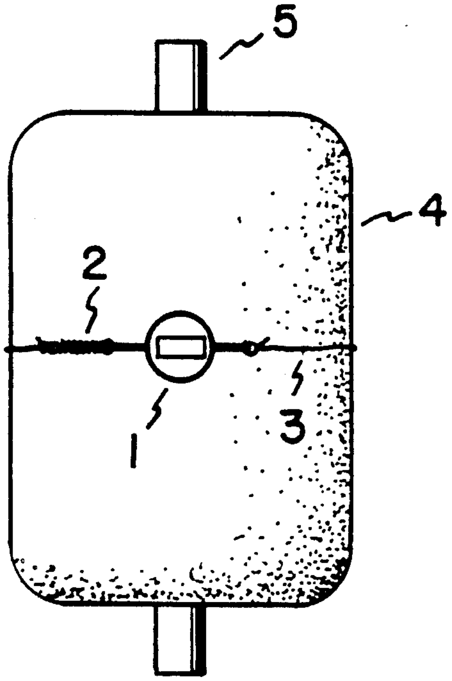
FIG. 1C

HOUR METER ACTIVATED BY MAGNETIC INFLUENCE

BACKGROUND OF THE INVENTION

Users of certain types of electrical apparatus often have need of a device to register the accumulated running time of the apparatus, whether for warranty, preventive maintenance, billing purposes, energy audit or duty analysis. As an example, consider a user of irrigation water supplied from a well regulated by a state agency. The agency often assumes that the water will be pumped at a given rate throughout a certain season. This means that a person who uses less water than the assumed amount is charged for the full amount anyway, unless he can show that his actual consumption was less than the assumed amount.

One way to make such a showing is to include an hour meter into the circuit supplying power to the motor of the pump. While this is in principle easy to do, it may well require the services of an electrician, especially if local electrical codes are to be observed, or if the job involves multi-phase circuits, or involves particularly high voltage or particularly high currents which would give the average layman cause for technical concern. Electricians, however, can be expensive, as can be the supplies needed to properly carry out the task. It would be beneficial if there were a quick, easy and low cost way to equip a piece of equipment with an hour meter, without the need for making any electrical connections to the equipment.

One way this can sometimes be done is with a so-called "vibratory" hour meter, such as is produced by Grasslin firm in the Federal Republic of Germany, and available in the United States from at least Fargo Controls, Inc., of Eatontown, N.J. In this type of device the inherent mechanical vibration in the equipment is coupled to the hour meter (by attachment of the hour meter thereto) and made to power the hour meter. However, a certain minimum vibratory excursion is required, depending upon the frequency of the vibration. And while vibratory hour meters are commonly used on internal combustion engines and other reciprocating machinery, such as compressors, many types of electrical machinery simply run too smoothly to activate a vibratory hour meter.

Furthermore, it may not always be possible nor desirable to mount the hour meter directly onto the casing or housing of the motor or its load, even if there is sufficient vibration at such a location. Perhaps these are enclosed and behind seals or cannot be conveniently accessed on a regular basis appropriate for reading the hour meter. In such a case it would be desirable to have at hand an hour meter that could be attached either directly to the motor or, if need be, merely placed in appropriate proximity to the electrical conductors supplying power to the motor.

SUMMARY OF THE INVENTION

An hour meter of the type described can be realized if it is responsive to the alternating magnetic field set up by the AC current that operates the motor or other load. As will be explained, inductive coupling of the hour meter to the magnetic field either in the operating motor itself or surrounding the supply conductors can supply sufficient energy to a voltage doubling rectifier to forward bias a transistor switch that activates a conventional LCD elapsed time indicator itself powered by a long life lithium battery. Although other designs are possible, (e.g., ones involving power amplification) in a preferred embodiment the actual sensing circuit that activates the elapsed time indicator does not itself consume any power from the battery, thus contributing very substantially to increased battery life.

BRIEF DESCRIPTION OF THE DRAWINGS

The invention to be described herein may be best understood with reference to the figures, wherein:

FIGS. 1A, 1B and 1C are respective side, top and front views of a magnetically activated hour meter attached by a spring-tensioned strap to a representative AC electric motor;

DESCRIPTION OF A PREFERRED EMBODIMENT

Figure 2:
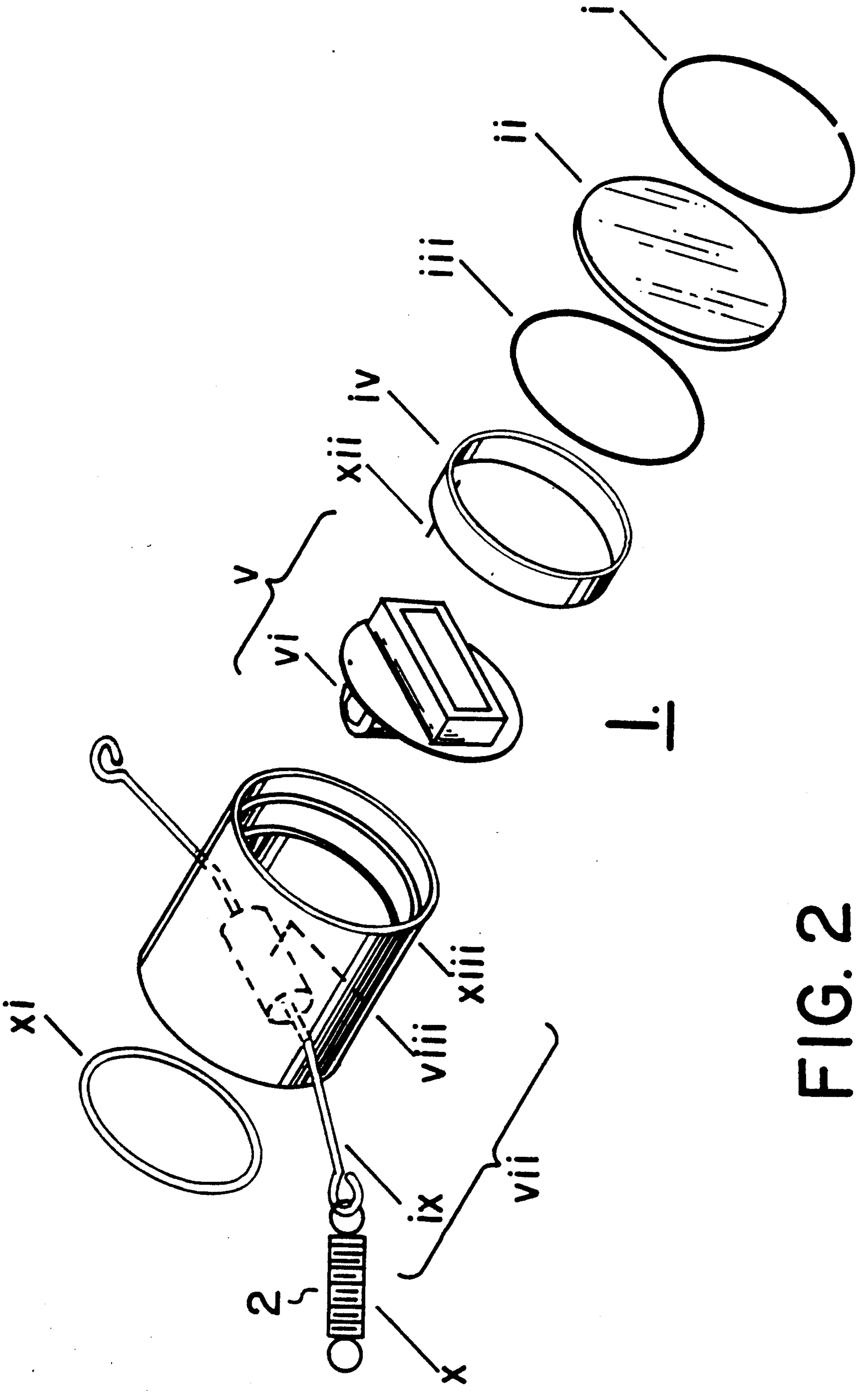
FIG. 2 is an exploded view of the hour meter of FIG. 1.

Refer now to FIGS. 1A–C wherein is shown a magnetically activated hour meter 1 attached by a spring 2 and band 3 to the housing of an AC motor 4. Note the orientation of the band 4 with respect to the motor shaft 5. Although the band 3 need not form part of a magnetic circuit (which is not to say it can't or won't, only that it needn't), as will shortly become clear a portion of the hour meter 1 does, and the design combines a convenience in mounting with sampling the magnetic flux leaking from the stator poles within the motor 4. Accordingly, the design assumes that the plane formed by the band 3 is parallel to the plane of the stator flux path, which in turn is perpendicular to the axis of rotation.

The band 3 can be of any convenient material that is of suitable strength, and need not be magnetically permeable. It could, for example, be a plastic strap, or it could be a metal band. The spring 2 is a simple extension spring of suitable stiffness to keep the hour meter 1 in place on the motor 4.

In final reference to FIGS. 1A–C, even though I have said that the motor is an AC motor, it is not a foregone conclusion that my device will be inoperative when used in conjunction with other classes of rotating electrical machinery. What activates the hour meter is an *alternating magnetic field*. Indeed, it is not a strict requirement that the housing to which the hour meter is attached even house a motor; it might be a generator, alternator, AC load contactor, or AC solenoid. In these examples, whether the alternating magnetic field is produced by a supplied EMF to cause mechanical rotation, or mechanical rotation is supplied to produce the EMF, or even in the absence of mechanical rotation, the alternating magnetic field is still present. It is the presence of this alternating magnetic field that activates my hour meter in the manner discussed in connection with FIG. 3 below.

Refer now to FIG. 2, which is an exploded view of the hour meter of FIG. 1, wherein the following reference numerals are to be understood as:

i ring, retaining
ii face plate
iii seal, O-ring
iv spacer
v circuit board assembly
vi battery, lithium, Panasonic BR-2/3AE2SP
vii body assembly viii coil assembly
ix rod, tie down
x spring, tie tensioning
xi base, O-ring
xii pin, registration
xiii housing Observe the cylindrical housing xiii, which may be made of any convenient material, preferably non-magnetic and impervious to the elements; e.g., a unitary part molded from a suitable plastic or perhaps simply a section of PVC tubing. Although it cannot be seen in the Figure, the bottom end of housing that receives o-ring xi has a solid end cap, which is a disc similar to face plate ii. The end cap is either an integral part of the housing xiii, or is securely glued to it. Attached to the end cap is an o-ring xi; its function is to provide a resilient non-skid surface to help make the hour meter stay put and to do what it can to reduce the coupling of vibration into the unit. It also helps provide thermal isolation, in the event the equipment being monitored runs somewhat on the warm side.

Now consider the tie down rod ix. It starts out as a piece of #9 AWG soft iron wire. This wire is drawn to straighten it, and then annealed by heating it cherry red for a few seconds, after which it is allowed to cool. The annealing promotes magnetic permeability. Following this, the coil viii is placed into the housing and the piece of annealed wire aligned with holes in the housing xiii and the coil viii. The wire is press fitted into the holes in the housing (to ensure weather tightness) until equal amounts extend from both sides of the housing xiii, after which the slight angular bends close to the housing and the eyes at the end are formed with the aid of suitable bending jigs.

The coil viii is a single winding solenoid of about 30,000 (thirty thousand) turns of #44 enameled wire. As assembly proceeds the diodes, capacitors and resistor of the voltage doubling rectifier circuit are attached to the coil proper and secured with a layer of tape. Connecting wires are then attached to circuit board assembly v, which itself then is seated against a stepped groove in the housing xiii. Located on the circuit board assembly is an LCD display, driven through suitable circuitry, to be described, by action of an alternating magnetic field coupled into the coil viii. Circuit board assembly v also incorporates a long life lithium battery, estimated to be able to power the unit for about ten years. Subsquently, a spacer iv incorporating a press fitted registration pin xii is inserted into the housing. The pin passes through a corresponding hole in the circuit board assembly v and engages a registration hole in the stepped shoulder against which the circuit board assembly v rests. (The registration hole is not visible.) This arrangement keeps the circuit board, the spacer, and also the face plate ii, from rotating in the housing. Next, an o-ring iii is seated down onto another stepped shoulder, and the face plate placed on top of it, taking care to ensure that the registration hole in the face plate ii engages the registration pin xii. The face plate has suitable silk screened legends, with an open window for viewing the LCD display. Finally, a snap ring i is worked into place. It seats in a groove in the housing, and serves to retain most of the foregoing parts.

Figure 3:
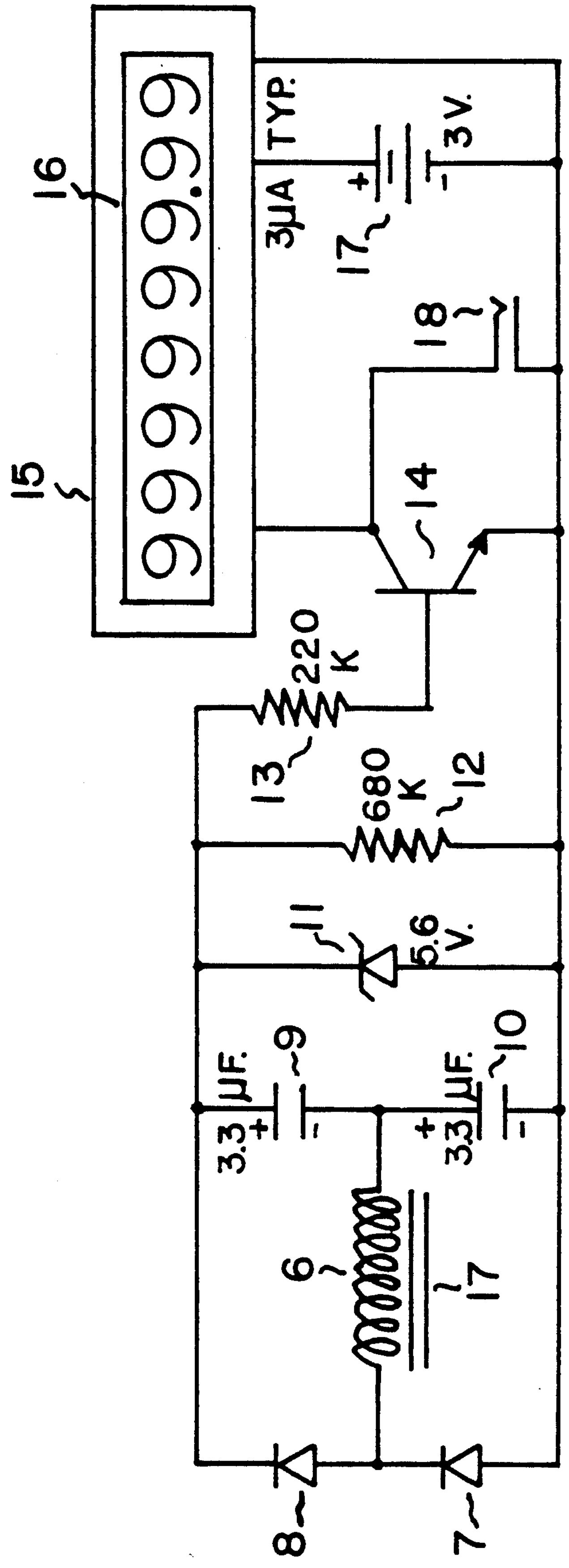
FIG. 3 is a schematic diagram of the circuitry within the hour meter of FIG. 2.

Refer now to FIG. 3 wherein is shown a schematic diagram of the electronic circuitry of the coil viii and circuit board assembly v of FIG. 2. Let's begin with coil 6 and its iron core 17. These correspond to elements viii and ix in FIG. 2, respectively. That is, coil 6 is the thirty thousand turn coil viii mentioned previously, and iron core 17 is the annealed soft iron tie down rod ix. Stray magnetic AC flux from the motor or other circuit to which the hour meter 1 is coupled induces an alternating voltage in the coil 6. To the extent that iron core 17/tie down rod ix has increased permeability and is placed in the midst of an alternating magnetic field, the greater the AC voltage that is induced in coil 6. Because the iron core 17/tie down rod ix conducts magnetic flux to the coil 6, the orientation of the hour meter 1 upon the device to be monitored is generally important. In cases where there is not a great deal of stray flux to begin with, it may be necessary for the tie down rod ix to be aligned with the lines of magnetic force within the magnetic fielo in order to maximize the size of the voltage induced in the coil 6.

Diodes 7 and 8 in conjunction with capacitors 9 and 10 function as a rectifying voltage doubler of the AC voltage induced in coil 6. Assume for the moment that the left-hand end of coil 6 (i.e., the end that is connected to the junction of the cathode of diode 7 with the anode of diode 8) is positive with respect to the right-hand end. The diode 8 is forward biased and in series with the coil 6 and capacitor 9, which then charges with the polarity shown in the Figure. During this half-cycle diode 7 is back biased. When the polarity across the coil 6 is reversed during the next half-cycle, diode 7 is forward biased and in series with the coil 6 and capacitor 10, which charges with the polarity shown in the Figure. During these other half-cycles diode 8 is back biased.

Note that the two capacitors 9 and 10 are in series, and that their polarities are in agreement rather than in opposition; hence the voltage doubler action as the voltage of the two capacitors add by virtue of being in series with the same polarities and magnitudes. The two capacitors 9 and 10 act as a source of EMF to turn switching transistor 14 on when there is sufficient alternating magnetic flux acting upon the turns of coil 6. The capacitors also perform a filtering action on the rectified voltage.

Zener diode 11 limits the magnitude of the voltage generated by the doubler rectifier just described, to prevent over-voltage damage to the capacitors or diodes in the presence of a strong magnetic field. Excessive currents are not a concern, since the impedance of the coil is about seven thousand ohms, and the iron rod can be expected to saturate.

Resistor 12 is there to provide a reasonable resistance to ground so that transistor 14 will be reliably kept off when no voltage is being induced into coil 6. It also helps provide a predictable discharge time for capacitors 9 and 10 once the alternating magnetic flux ceases, so that switching transistor 14 is not held on unduly long thereafter.

The function of resistor 13 takes a bit more explanation. It begins with the following fact. When transistor 14 is on it does not carry a steady DC collector current. Instead, it sees (from the timer 15) a thirty-two microsecond pulse once every four milliseconds. During the other 99% of the time there is no collector current, and if resistor 13 were replaced by a short circuit, the voltage across the series combination of capacitors 9 and 10 would be only that across the forward biased emitter-base junction of transistor 14. Unfortunately, it would be the base voltage for *no* collector current. As for the pulse of would-be collector current, the emitter resistance of the transistor adds an additional voltage in series with the emitter-base drop. With the base voltage fixed at its old value, the amount of forward bias available during the attempted pulse of collector current will be reduced, and the transistor starved for base current. It will then not adequately pass the pulse of collector current needed to signal the timer 15 to run. By putting resistor 13 in series with the base current the capacitors and resistor 13 act more like a current source capable of keeping adequate current flowing through the base, regardless of slight changes in the voltage developed (as a function of changes in collector current) in the emitter circuit of transistor 14.

Transistor 14 itself is simply an ordinary switching transistor, save that it must have fairly high beta (say, 400) at relatively low collector currents. For example, a Motorola MPSA18 works well. It is noted that a FET might be used in place of the present bipolar device. A bipolar device is preferred because of the smaller voltage change needed to activate it as a switch. Likewise, actual power amplification of the signal from the coil or rectifier is also possible, but at the expesne of considerable battery drain. The preferred circuit described herein is entirely self-powered as far as signalling the timer 15 to run. That is, the power needed to turn on transistor 14 comes entirely from the external circuit being monitored, (by virtue of the inductive coupling) and *not* from any battery or other source of power within the hour meter.

Finally, note the timer 15. It is of the three terminal type, where two of the terminals receive a battery 17, and the third goes through a switch back to one side of the battery. The timer runs when the switch (which in this case is transistor 14) is on, thus passing the aforementioned pulse of current, and does not run when it is off. The timer may be a SYRELEC type C108 Elapsed Time Counter.

The timer may optionally also be started by external contact closure through jack 18, should that be desirable.

If sufficient current is drawn by the device to be monitored, then it is sufficient to simply put one end of the tie down rod ix into close proximity with and between a pair of the conductors supplying the current. This puts the end of the tie rod "inside" the loop carrying the current to the load. The magnetic lines of flux from the two conductors combine to increase the size of the signal induced in the coil of the hour meter. If the end of the tie rod were placed "outside" the loop, then the magnetic flux from the conductors would essentially cancel. It has been found that a current a small as four amperes in a pair of conductors is sufficient to activate the hour meter during such "proximity" usage.

I claim:

1. An hour meter for registering elapsed running time of a work apparatus, the hour meter comprising:

sensing means, responsive to an alternating magnetic field, for inducing directly from stray magnetic flux escaping from the work apparatus an electrical activity signal that is in a first state in the absence of an alternating magnetic field of at least a certain sufficient magnitude and that is in a second state in the presence of an alternating magnetic field that is of the sufficient magnitude; and timer means responsive to the electrical activity signal by accumulating the elapsed time during which the electrical activity signal is in the second state and by not accumulating when the electrical activity signal is in the first state.

2. An hour meter as in claim 1 wherein the sensing means is a coil, wherein the timer means includes a switching transistor having a control lead coupled to the activity signal, another lead coupled to a common terminal of the timer means and a remaining lead coupled to a control terminal of the timer means.

3. An hour meter as in claim 1 wherein the sensing means further comprises a coil wound around a cylindrical axis through which passes a magnetically permeable core having ends extending beyond the sides of the coil and which are fitted to receive a strap for attaching the hour meter onto the work apparatus from which an alternating magnetic field is expected to emanate.

4. An hour meter as in claim 3 further comprising a housing and wherein the magnetically permeable core is a length of soft iron wire extending outside the housing in generally opposite locations of the housing.

5. An hour meter as in claim 1 wherein the sensing means further comprises a coil connected to a rectifying voltage doubler circuit whose output is the electrical activity signal.

6. An hour meter comprising:

sensing means inductively coupleable to an alternating magnetic field, for producing an induced AC voltage indicative of the operation of a work apparatus producing the alternating magnetic field;

control means, responsive to the induced AC voltage, for enabling a timer to run when the induced AC voltage exceeds a threshold and for not enabling the timer to run when the induced AC voltage does not exceed the threshold; and timer means, coupled to the control means, for accumulating the elapsed time during which the timer means is enabled to run.

7. An hour meter as in claim 6 wherein the control means includes a rectifier and a filter.

8. An hour meter as in claim 7 wherein the rectifier and filter are a voltage doubler.

9. An hour meter as in claim 6 wherein the control means includes a transistor and the threshold is the voltage needed to forward bias the transistor.

* * * * *